(12) United States Patent
Pourrahimi

(10) Patent No.: US 9,638,774 B2
(45) Date of Patent: May 2, 2017

(54) DISCHARGE CONTROLLED SUPERCONDUCTING MAGNET

(71) Applicant: Shahin Pourrahimi, Brookline, MA (US)

(72) Inventor: Shahin Pourrahimi, Brookline, MA (US)

( * ) Notice: Subject to any disclaimer, the term of this patent is extended or adjusted under 35 U.S.C. 154(b) by 918 days.

(21) Appl. No.: 13/959,327

(22) Filed: Aug. 5, 2013

(65) Prior Publication Data

US 2015/0346299 A1    Dec. 3, 2015

(51) Int. Cl.
| | | |
|---|---|---|
| *G01V 3/00* | (2006.01) |
| *G01R 33/3815* | (2006.01) |
| *H02J 15/00* | (2006.01) |
| *H01F 6/00* | (2006.01) |
| *G01R 33/38* | (2006.01) |

(52) U.S. Cl.
CPC ......... *G01R 33/3815* (2013.01); *H01F 6/003* (2013.01); *H02J 15/00* (2013.01); *G01R 33/3804* (2013.01)

(58) Field of Classification Search
CPC .................................................. G01R 33/3815
USPC .......................... 324/320, 319, 318; 335/216
See application file for complete search history.

(56) References Cited

U.S. PATENT DOCUMENTS

| | | | | |
|---|---|---|---|---|
| 5,847,633 A | * | 12/1998 | Keller ................ | G01R 33/3815 324/318 |
| 8,405,410 B2 | * | 3/2013 | Kawashima ......... | G01R 31/024 324/706 |
| 2007/0024404 A1 | * | 2/2007 | Westphal .................. | H01F 6/00 335/216 |
| 2010/0295641 A1 | * | 11/2010 | Schild ..................... | H01F 6/008 335/216 |
| 2012/0014030 A1 | * | 1/2012 | Ichiki ........................ | H01F 6/02 361/141 |
| 2015/0255200 A1 | * | 9/2015 | Solovyov ................ | H01L 39/16 335/216 |

\* cited by examiner

*Primary Examiner* — Louis Arana
(74) *Attorney, Agent, or Firm* — Arjomand Law Group, PLLC

(57) ABSTRACT

A Cryogen-Free (CF) type MRI superconducting magnet system capable of monitoring the conditions of the system components and, in case of a foreseeable quench, discharging the superconducting magnet at any desired discharge voltage before occurrence of quench.

20 Claims, 2 Drawing Sheets

DISCHARGE CONTROLLED SUPERCONDUCTING MAGNET

CROSS-REFERENCE(S) TO RELATED APPLICATION(S)

This application claims the benefit of the filing date of the U.S. Provisional Patent Application No. 61/679,695, entitled "Integrated Power Supply for a Persistent Mode Cryogen Free Superconducting Magnet," and filed on Aug. 4, 2012, under 35 U.S.C. §119(e).

TECHNICAL FIELD

This application relates generally to superconducting magnets. More specifically, this application relates to discharge-controlled MRI type superconducting magnets.

BRIEF DESCRIPTION OF THE DRAWINGS

The drawings, when considered in connection with the following description, are presented for the purpose of facilitating an understanding of the subject matter sought to be protected.

DETAILED DESCRIPTION

While the present disclosure is described with reference to several illustrative embodiments described herein, it should be clear that the present disclosure should not be limited to such embodiments. Therefore, the description of the embodiments provided herein is illustrative of the present disclosure and should not limit the scope of the disclosure as claimed.

Magnetic Resonance Imaging (MRI) scanners are used for biomedical research and diagnosis of human disease and disorder. Imaging by an MRI scanner requires a very uniform, substantially constant, and stable magnetic field over a specific volume. Conventionally, such a magnetic field, often referred as $B_0$ field, is produced by a permanent or a superconducting magnet. For human applications MRI devices that use permanent magnets typically generate $B_0$ magnetic field of less than 1.0 T (Tesla), and for research on animals less than 1.5 T. For higher resolution imaging, superconducting magnets that produce higher magnetic fields are used. Superconducting $B_0$ magnets use coils that must be maintained at cryogenic temperatures which are lower than the critical temperature of the superconducting coils. Traditionally, to achieve such low temperatures, the coils of a superconducting MRI magnet operate in a pool of liquid helium, which keeps the coils at about 4.2° K.

An alternative to operating MRI superconducting coils in a pool of liquid helium is to cool the coils by a cryocooler which is connected to the coils by solid materials that conduct heat away from the coils. Typically these types of magnets are called Cryogen-Free ("CF") or conduction cooled magnets.

One of the customary methods of achieving a substantially constant magnetic field is to operate the superconducting magnet of an MRI system in the so called "Persistent Mode," in which mode the current circulates, almost perpetually, through a considerably zero-resistance closed-loop set of coils. The advantage of the persistent mode is the constancy of the magnetic field, which is better than what can be achieved in the normal mode even with the best power supplies. Furthermore, in the persistent mode no additional energy is needed to power the windings and, therefore, the power supply can be turned off.

Figure 1:
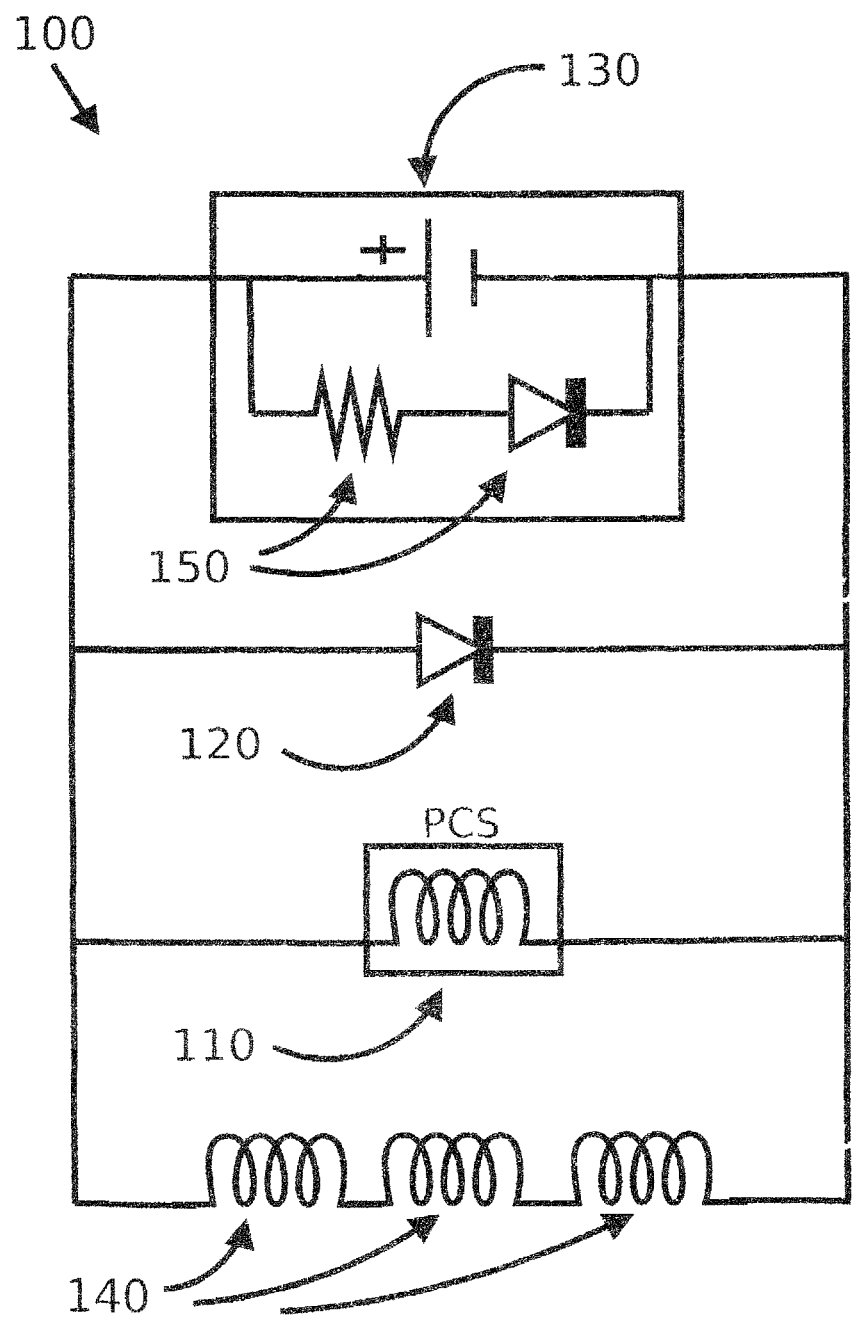
FIG. 1 schematically shows a traditional superconducting-magnet MRI machine.

To switch the superconducting magnet from the driven mode into the persistent mode after energizing the magnet, a "Persistent Mode Switch" is used. For MRI magnet application a persistent mode switch is typically a non-inductive coil made from special superconducting wires. When the temperature of this "Switch Coil" is below its critical temperature the coil is superconducting with practically zero resistance, and when the temperature of the switch coil is above its critical temperature the switch coil is in normal state and has resistance, for example 10 to 1000 ohms. In a typical MRI superconducting magnet a suitable switch coil with proper normal state resistance is connected to the coils of the magnet such that the switch coil and the magnet coils form a closed loop. FIG. 1 shows the principle elements of the circuit of a typical MRI magnet.

To operate the magnet in the persistent mode, first the switch coil and the magnet coils need to be cooled to their superconducting state. Subsequently the persistent mode switch is heated to normal state. At this stage, the power supply is used to charge the magnet coils to the target operating current. After reaching the desired current in the magnetic coils, the switch coil is cooled until the switch coil switches to superconducting state. While the switch coil is in the normal state and has resistance only a small current passes through it, but when the switch is cooled to its superconducting state and substantially shows no resistance, almost all the current that goes through the magnet coils is short circuited through the switch coil and continue to circulate through the closed loop formed by the switch coil and the magnet coils. At this point the coils are said to be in the persistent mode and the power supply is usually turned off.

Note that when the persistent mode switch coil is heated to its normal mode, because of the small amount of current that passes through it the persistent mode switch coil generates its own heat, so much that the heater may be turned off. In some situations, for example depending on the resistance of the switch coil in the normal state, the balance of the heat generated by the heater and the switch coil can be used to accommodate particular applications.

If for any reason, such as a power or a system component failure, the temperature of any of the superconducting coils of a superconducting magnet system rises above its critical or transition temperature, that coil and then all other coils in the magnet system may transition from superconducting state to normal state. In such a situation, the superconducting magnet is said to have "Quenched." During the quench of a superconducting magnet the stored energy of the magnet is converted into heat. The stored energy of an MRI magnet, depending on its size and its magnetic field, may be a few hundred kilo-joules to over a few mega-joules. In a CF magnet, when a cryocooler, or system of cryocoolers, shuts down, heat input to the superconducting coils raises relatively fast and therefore the temperature of coils rise relatively fast, which can lead to quench. Therefore, a concern regarding CF MRI type magnets is the consequence of loss of electrical power and hence the cryocooler shutdown and ultimately a quench.

Conventional cryocoolers used in the MRI superconducting magnets provide 0.5-1.5 W of cooling power at about 4° K, which is close to the heat input into a CF MRI type superconducting magnet operating in steady state conditions. Therefore, if the cryocooler of a CF MRI type superconducting magnet shuts down, the magnet will be subject to at least tens of joules of heat input from its structure and its environment, per minute of cryocooler shutdown. Furthermore, when a magnet quenches, a few hundred or thousand kilo-joules or more of heat is dissipated by the release of the stored energy of the magnet. An MRI type superconducting magnet needs to have a quench protection system that allows the magnet to quench safely in the event of a human error or unusual incidents that are or are not related to the cooler shutdown. Without suitable quench protection system the superconducting coil(s) can experience damaging voltages or temperature rises. This is the reason that a quench protection scheme is an integral part of most superconducting magnets, especially MRI type magnets that store more than few hundred or thousands of kilo-joules of energy.

In case of a quench of a CF magnet, almost all the stored energy is absorbed by the coils and structure components that operate at below critical temperature of the coils, which together are often referred to as the "Cold-Mass." In contrast, in a conventional magnet operating in a pool of helium, some of the stored energy is absorbed by helium and causes the helium to boil and evaporate. In a conventional magnet operating in a pool of helium heat leak into the magnet system does not coincidentally result in the temperature rise of the cold-mass because the heat leak is substantially absorbed by liquid helium as long as there is liquid helium. This is why the rise of temperature of the cold-mass of a magnet operating in liquid helium is slower than the rise of temperature of a comparable cryogen-free magnet and similarly the resulting highest temperature of the cold-mass of the non cryogen-free magnet is less than the resulting highest temperature of the comparable cryogen-free magnet. Therefore, when a CF MRI type magnet quenches, more than a few hundred or thousand kilo-joules of heat need to be removed from the magnet cold-mass before coils can be charged again to create a steady magnetic field. Using a conventional cryocooler that is used by the MRI superconducting magnet industry, it will take a few days or more to remove more than a few hundred kilo-joules or few mega-joules of heat from a quenched CF superconducting magnet. Therefore, shut down of a cryocooler can result in loss of MRI operations for a few days or more.

It is desirable to be able to control the rate and conditions of discharge of a CF MRI type superconducting magnet and allow its stored energy to be transferred not to the cold mass but, preferably, to a heat-sink or heat-exchanger outside of the magnet cryostat. As mentioned before, a fast discharge of the stored energy is more critical in a cryogen-free system than it is in a non cryogen-free system.

FIG. 1 schematically shows the basic circuit of a conventional superconducting magnet 100 which has a Persistent mode Current Switch (PCS) 110, one or more quench protection diode(s) 120 positioned with the magnet so that they operate at cryogenic temperatures, a power supply 130, which includes a resistor or a resistor-diode combination 150, and a set of superconducting magnetic coil windings 140. For charging the magnetic coil windings 140, PCS 110 is made to open (be resistive), for example by warming PCS 110 and keeping it in the normal state, and the power supply 130 is set at a charging voltage that is less than the threshold voltage of the quench protection diode(s) 120. In such a set up, current flows and increases in the superconducting coil set 140. When the desired current is achieved, warming of PCS 110 is stopped and it is allowed to cooled off to superconducting state and close (zero resistance), and current will (almost) perpetually circulate through the closed-loop coil formed by the superconducting coil set windings 140 and PCS 110. While in the persistent mode, PCS 110 is kept in the superconducting state.

It is important to note that the behavior of a relatively massive quench protection diode operating in cryogenic temperatures is different from that of a theoretical diode in which once the voltage across the diode reaches the diode's threshold voltage the diode starts conducting and while in the conduction state sustains a voltage substantially equal to the threshold voltage across it. The threshold voltage of the quench protection diodes operating in cryogenic temperatures, for starting the conduction, is noticeably higher than the voltage across these diodes while in the conduction state. For example some of the quench protection diodes may need 10 volts across them to start conduction but their conduction voltage drops to about 1 volt while conducting. The relatively high threshold voltage of quench protection diode(s) 120, for example 10 volts allows the power supply to charge the magnetic coil windings 140 at a desirable voltage below 10 volts, for example 5 volts. In such an arrangement, diode(s) 120 remains open and the current from the power supply 130 goes through the coils 140 and the switch coil 110. The benefit of the protection diode(s) 120 in the circuit of FIG. 1 is in case of a quench where the voltage across the coil terminal can increase to values larger than 10 volts. Note that when the voltage across terminal of a quenching coil is at a certain value the voltage within the coil winding may be several times larger, which can damage the coil winding. Therefore, during a quench, it is desirable to limit the rise of the voltage at coil terminals without limiting the ability to charge the magnet at a reasonably high voltage. In case of a quench, the protection diode 120 closes when the voltage across coil 140 reaches 10 volts but the voltage across the Protection Diode 120 drops to about 1 volt just after the protection Diode 120 starts conducting. The benefit of this particular diode behavior is that charging of the magnet at a desirable voltage, for example 5 volts, is not inhibited in ordinary conditions, but when the extraordinary condition of quench occurs diode 120 protects the coil from over voltage. The benefit of the drop of the voltage from 10 volts to 1 volt during closing of the diode is that the protection diode does not get too warm or hot when current flows through it.

In summary, while the high threshold voltage of a quench protection diode 120 (e.g. 10 volts), which is much higher than its conduction voltage (e.g. 1 volt), allows the power supply 130 to charge the magnetic coil windings 140 at a high voltage (e.g. 5 volts), it limits the discharge voltage to 10 V, which may not suit the discharge rate needed to discharge the magnet before a potential quench. Increasing the number of diodes 120 to increase the discharge voltage, which increases the voltage within the coil winding several folds, can lead to a dangerous compromise in quench protection. During a discharge, depending on the number of quench protection diodes 120, the voltage between the terminals of the coil windings 140 can rise by one or more diode threshold voltages before quench protection diode(s) 120 starts conducting (closes) and lowering the terminal voltage of the coil windings 140 and, therefore, lowering the discharge voltage of the coil windings 140. Hereinafter, this temporary rise and fall of the discharge voltage, caused by the particular behavior of the quench protection diode(s) 120 is referred to as "transitory" or "momentary" voltage rise or voltage spike.

In ordinary conditions when a CF magnet is being charged the cryocooler is in operation and there is not a reason to charge the magnet particularly fast. But in extraordinary conditions, for example, when the cryocooler is not working, there is an incentive to discharge the magnet relatively fast before the magnet quenches.

To discharge the magnet in FIG. 1, PCS 110 is heated up and made to open and, therefore, the current flows mostly through power supply 130 and therefore the stored energy of the coil dissipates through power supply 130. Preferably, the resistors and or diodes 150 that are incorporated in power supply 130 should not give rise to discharging voltages that can overcome the threshold voltage of diode 120. However, should diode 120 close, part of the stored energy of the magnet dissipates through diode 120, which is only for quench protection reasons, and therefore could heat up the superconducting magnet system 100, which is not desirable. In a quench situation, diode 120 limits the discharge voltage across the power supply to the steady state conduction voltage of diode 120 but, as mentioned above, to start conducting the discharge voltage briefly rises to the threshold voltage of diode 120 which may be ten times its steady state conduction voltage. By merely adding one diode to diode 120, the discharging limit increases, for example by 1 volt, but the brief voltage rise to overcome the sum of the diode thresholds increases by 10 volts. For example if there are four quench protection diodes 120, the discharge voltage would be about 4 volts but there would also be a momentary rise of the discharge voltage to about 40 volts which means that the voltage within the coils could be excessively high and can damage the coil or some other components of the system. As can be observed, while adding to the number of quench protection diodes 120 can increase the charging and discharging voltage limits of system 100, it will also drastically increase the momentary rise of the discharge voltage which can damage some components of the system.

Briefly described, a method, a system, and an article of manufacture are disclosed for an automatically controlled cryogen-free MRI type superconducting magnet that is capable of performing the following functions without causing damaging momentary rise of discharge voltages:

1) Charge the superconducting magnet;
2) Switch the magnet to Persistent Mode;
3) Track and detect operating conditions and monitor the cooling system and the power line status;
4) Predict an uncontrolled quench and, in case of some predetermined conditions, discharge the superconducting magnet by transferring the stored energy to an external heat sink; preferably outside the cold structure of the magnet system;
5) Restart the cryocooler as proper operating conditions are restored; and
6) Repeat steps (1) and (2).

Conventional power supplies that are used by MRI type superconducting magnets only perform steps (1) and (2) and discharge the magnet at voltages that are close to the charging volatge. One of the advantages of the disclosed method, system, and article of manufacture is the implementation of step (4), which discharges a persistent mode superconducting magnet at any desired high-discharge-voltage before the magnet quenches, without producing transitory damaging high voltages.

Figure 2:
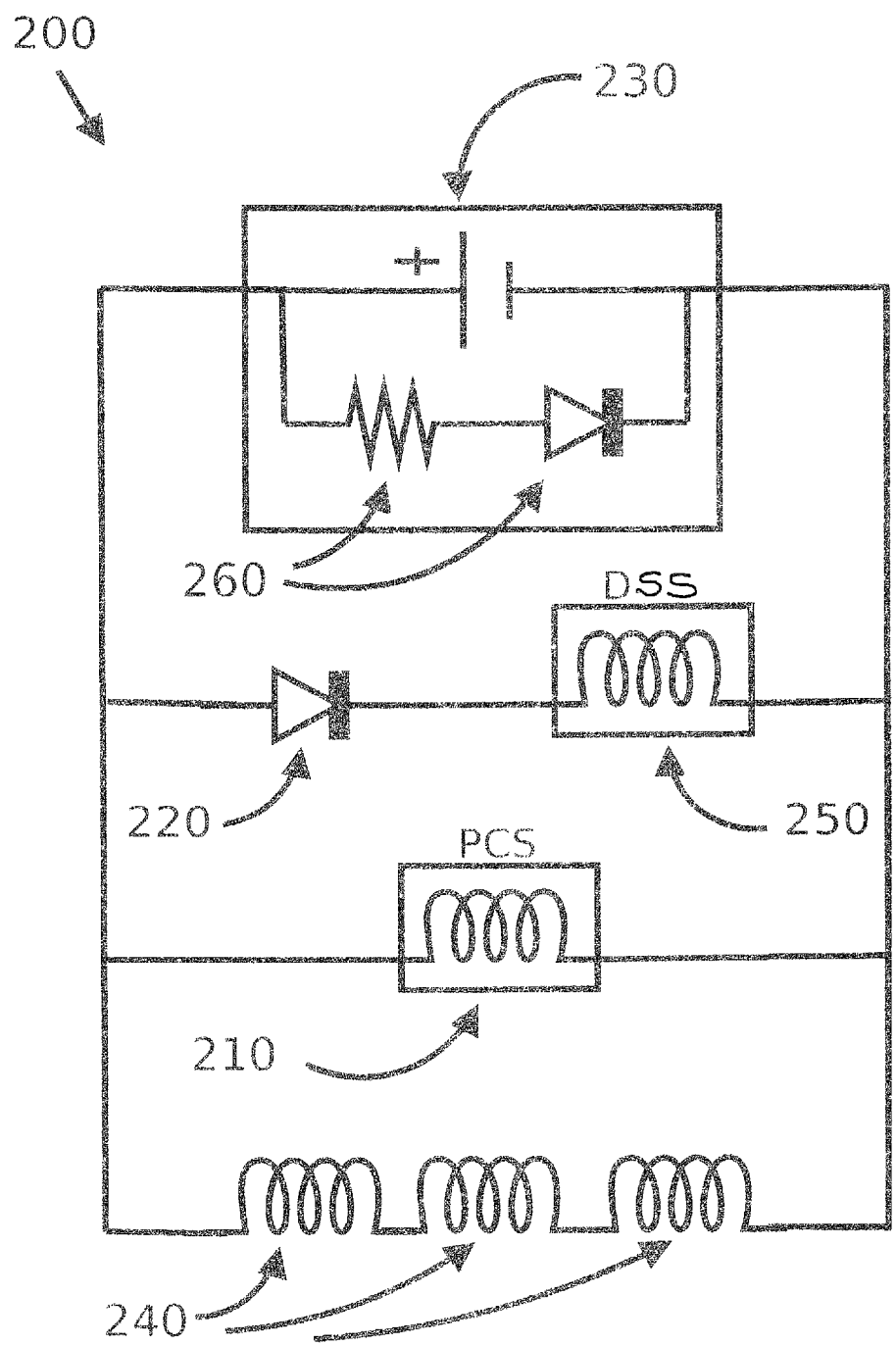
FIG. 2 shows an example embodiment of a discharge controlled superconducting-magnet MRI machine.

FIG. 2 schematically shows the basic circuit of an advanced superconducting magnet 200 which has a Persistent mode Current Switch (PCS) 210, a quench protection diode 220, a power supply 230, which includes a resistor, a diode, or a resistor-diode combination 260 (hereinafter called "resistor-diode combination 260"), and magnetic coil windings 240. The advanced superconducting magnet 200 also has a Discharge Superconducting Switch (DSS) 250, or any other similar controllable-voltage or controllable-resistance element, that is used to control the voltage across the combination of the quench protection diode 220 and DSS 250 and, therefore, to control the discharge voltage of the magnetic coil 240. In FIG. 2, charging the magnet follows as described for the circuit of FIG. 1 while keeping the DSS 250 closed (superconducting).

In a discharge situation, control of the voltage across the combination of the quench protection diode 220 and DSS 250 directly translates to the control of the rate of energy dissipation by power supply 230 and the associated resistor diode combination 260. Using DSS 250, or any other controllable-voltage or controllable-resistance element, allows the controllability of energy dissipation at higher discharge voltages, compare to the system of FIG. 1, without the dangerous transitory voltages caused by the behavior of the quench protection diodes 120. DSS 250, or any other controllable-voltage and/or controllable-resistance element, and the resistor-diode combination 260 may be all strategically located for heat and temperature management as well as for other considerations.

In the circuit of FIG. 2, quench protection is provided as follows. Prior to quench, both PCS 210 and DSS 250, or any other functionally similar element, are closed and are in superconducting state and, therefore, diode 220 cannot conduct. In this arrangement, current circulates though coil 240 and PCS 210. When quench occurs voltage across the combination of the quench protection diode 220 and DSS 250 increases and forces diode 220 to conduct and route the current through diode(s) 220 and DSS 250; therefore, limiting voltage rise across coil 240 while dissipating some energy through resistor-diode combination 260. In this situation, unlike in traditional systems, the voltage across the coils, across the resistor-diode combination 260, and across the diode-DSS combination (220 and 250) can be limited by controlling the resistivity of DSS 250 without the momentary rise in the discharge voltage caused by multiple quench protection diodes.

Another advantage of the diode-DSS combination (220 and 250) over the traditional MRI system of FIG. 1 is that the discharge voltage limits of system 200 are not merely stepwise but also can be continuously controllable. In the disclosed MRI system 200, while the coil magnet 240 can still be charged at a low voltage, the coil magnet 240 can be controllably discharged at any desired higher voltage without damaging the system components. (The controllable high discharge voltage is usually lower than a critical voltage of the coil winding, above which the coils may be damaged.)

The steady state discharge voltage and the momentary voltage spike in the traditional system of FIG. 1 are practically uncontrollable and merely a function of the quench protection diode characteristics. Additionally the circuit of FIG. 1 protects the system by simply reacting to the voltages across diode(s) 120. On the other hand, the circuit in FIG. 2 provides the user with the capability to proactively prepare the system for a possible quench by opening, closing, and controlling the resistance of DSS 250 at any time and discharging the system energy at any desired rate based on the information received from the system 200.

It should be noted that when the current flows through diode 220, it generates heat and its temperature increases. While this helps with the decay of current in the quenching coil set 240, it can have an adverse effect on DSS 250, the temperature of which needs to be controllable at least during a portion of the quench. Therefore, DSS 250 is strategically located within the magnet system 200 such that, for example, the temperature rise of diode 220 does not cause DSS 250 to heat up to the point of switching to normal state. In some embodiments DSS 250 may be made from High Temperature Superconductor (HTS) wires or tapes and may be located in a region of the superconducting magnet system 200 that is connected to a first stage of multiple cooling stages of the cryocooler. In other embodiments either or both diode 220 and DSS 250 may be mounted on individual heat sinks to limit their temperature rise during a quench.

To accomplish the higher level tasks described with regard to the superconducting magnet system of FIG. 2, sensors and computers/processors may be utilized to feedback and/or control the following measurements and functions:

i. Monitor temperature of the superconducting magnet system 200 at various locations including but not limited to superconducting coils 240, and various switches;
  ii. Monitor the performance of the cryocooler.
  iii. Monitor the magnetic field of the magnet system.
  iv. Monitor voltages at strategic locations of the magnet system.
  v. Turn the cryocooler ON and OFF per operational requirements of the magnet system.
  vi. Charge and discharge the magnet according to steps (1) to (5) above and according to the specific operational requirements of the overall magnet system.
  vii. Reset fault conditions as required (e.g. upon restoration of power or restoration of water flow).

In the disclosed system 200, a computer may monitor and control some of the components of system 200 and along with some sensors perform tasks (i) through (vii), as detailed above. In some embodiments, the power supply 230 has batteries and/or capacitors that allow it to discharge the magnet in the case of an electric power outage. In other embodiments the power supply 230 is capable of turning itself back to ON conditions when the external electric power is restored. In yet other embodiments the computer in the system 200 is connected to the internet for remote control and monitoring and may have a cooling mechanism.

Those skilled in the art realize that although all examples presented in this disclosure are related to CF type MRI magnets, the disclosed methods are applicable to other superconducting magnet systems that, for example, include liquid helium. Furthermore, Liquid is a heat reservoir and it is used for its convenience. There are other heat reservoirs such as solid neon, or solid nitrogen, or sealed helium gas, etc. These methods can lead to saving of liquid helium, which are used in large quantities for cooling during a quench operation of such magnets.

Particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the claimed invention to the specific embodiments disclosed in the specification, unless the above Detailed Description section explicitly defines such terms. Accordingly, the actual scope of the claimed invention encompasses not only the disclosed embodiments, but also all equivalent ways of practicing or implementing the claimed invention.

The above specification, examples, and data provide a complete description of the manufacture and use of the composition of the invention. Since many embodiments of the invention can be made without departing from the spirit and scope of the invention, the invention resides in the claims hereinafter appended. It is further understood that this disclosure is not limited to the disclosed embodiments, but is intended to cover various arrangements included within the spirit and scope of the broadest interpretation so as to encompass all such modifications and equivalent arrangements.

While the present disclosure has been described in connection with what is considered the most practical and preferred embodiment, it is understood that this disclosure is not limited to the disclosed embodiments, but is intended to cover various arrangements included within the spirit and scope of the broadest interpretation so as to encompass all such modifications and equivalent arrangements.

What is claimed is:

1. An MRI type superconducting magnet system comprising:
   a coil winding for generating a magnetic field in a normal and in a superconducting state;
   a power supply for charging and discharging the coil windings, wherein the power supply includes a resistor, a diode, or both a resistor and a diode to dissipate energy while discharging the coil winding;
   a Persistent mode Current Switch (PCS) configured to form an electrically closed-loop with the coil windings while in a superconducting state; and
   a combination of a diode and a controllable-voltage element or a diode and a controllable-resistance element connected across the coil winding terminals, wherein controlling the voltage across the controllable-voltage element or the resistance of the controllable-resistance element controls discharge voltage of the coil winding.

2. The system of claim 1, wherein the superconducting magnet includes a cryocooler for its cooling.

3. The system of claim 1, wherein the superconducting magnet is cooled through conduction, by a cryocooler.

4. The system of claim 1, wherein the controllable-resistance element is a Discharge Superconducting Switch (DSS).

5. The system of claim 1, wherein the controllable-voltage element or the controlled-resistance element is strategically located for heat transfer considerations.

6. The system of claim 1, wherein the control of the voltage across the controllable-voltage element or the resistance of the controllable-resistance element includes heating or cooling of the controllable elements.

7. The system of claim 1, wherein the power supply resistor, diode or, resistor and diode are strategically located for heat transfer considerations.

8. The system of claim 1, wherein PCS is a non-inductive coil of superconducting wires.

9. A quench-controlled MRI type superconducting magnet machine comprising:
   a coil winding for generating a magnetic field in a normal and in a superconducting state;
   a power supply attached to coil winding terminals;
   a resistor, a diode, or both a resistor and a diode disposed between the coil winding terminals configured to dissipate energy while discharging the coil winding;
   a Persistent mode Current Switch (PCS) configured to form an electrically closed-loop with the coil winding while in a superconducting state; and
   a series combination of a diode and a controllable-resistance component disposed across the coil winding terminals or across the power supply, wherein controlling the resistance of the controllable-resistance component controls the discharge voltage of the coil winding.

10. The machine of claim 9, wherein superconducting magnet cooling system is cryogen-free.

11. The machine of claim 9, wherein the superconducting magnet is cooled by a cryocooler.

12. The machine of claim 9, wherein the controllable-resistance component is a Discharge Superconducting Switch (DSS).

13. The machine of claim 9, wherein the controllable-resistance component is strategically located for heat transfer considerations.

14. The machine of claim 9, wherein the control of the controllable-resistance component comprises heating or cooling of the controllable-resistance component.

15. The machine of claim 9, wherein the power supply resistor, diode or, resistor and diode are strategically located for heat transfer considerations.

16. The machine of claim 9, wherein the controllable-resistance component is configured to operate in a normal resistive state and a superconducting non-resistive state.

17. A superconducting-magnet discharging method, the method comprising:
    charging a superconducting coil winding at a first voltage until a desired magnetic field is achieved;
    electrically connecting coil winding terminals together by a superconducting material such that a closed-loop coil is formed and a persistent-mode is achieved;
    monitoring indicators of potential of a quench situation;
    opening the closed-loop coil upon sensing the potential of a quench situation;
    discharging current generated by collapsing magnetic field through heat-generating elements; and
    controllably limiting the voltage across the coil winding during the discharging process and maintaining a desired discharge voltage at a second voltage, wherein the second voltage is higher than the first voltage.

18. The method of claim 17, wherein the controlled discharge voltage is continuous and is not step-wise, and wherein the controlled discharge voltage is higher than the charging voltage but lower than a critical voltage of the coil winding.

19. The method of claim 17, wherein the controlling of the discharge voltage is comprises using a series combination of a diode and a superconducting material placed across the coil winding terminals.

20. The method of claim 17, wherein controlling the voltage across the coil winding is performed by a Discharge Superconducting Switch (DSS).

* * * * *